(12) United States Patent
Vernickel et al.

(10) Patent No.: US 7,728,594 B2
(45) Date of Patent: Jun. 1, 2010

(54) MAGNETIC RESONANCE IMAGING SYSTEM PROVIDED WITH AN ELECTRICAL ACCESSORY DEVICE

(75) Inventors: Peter Vernickel, Hamburg (DE); Steffen Weiss, Hamburg (DE); Bernhard Gleich, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 825 days.

(21) Appl. No.: 11/568,117

(22) PCT Filed: Apr. 21, 2005

(86) PCT No.: PCT/IB2005/051307

§ 371 (c)(1),
(2), (4) Date: Oct. 20, 2006

(87) PCT Pub. No.: WO2005/103748

PCT Pub. Date: Nov. 3, 2005

(65) Prior Publication Data

US 2007/0229079 A1    Oct. 4, 2007

(30) Foreign Application Priority Data

Apr. 23, 2004    (EP) .................................. 04101701

(51) Int. Cl.
*G01V 3/00*    (2006.01)
(52) U.S. Cl. ........................................ 324/322; 324/318
(58) Field of Classification Search ................. 324/322, 324/318
See application file for complete search history.

(56) References Cited

U.S. PATENT DOCUMENTS

| 3,690,313 | A |   | 9/1972 | Weppner et al. |
|-----------|---|---|--------|----------------|
| 5,355,087 | A | * | 10/1994 | Claiborne et al. ........... 324/322 |
| 5,807,253 | A |   | 9/1998 | Dumoulin et al. |
| 6,677,754 | B2 |  | 1/2004 | Kestler et al. |
| 7,205,768 | B2 | * | 4/2007 | Schulz et al. ............... 324/322 |
| 2004/0004460 | A1 | | 1/2004 | Fitch et al. |

FOREIGN PATENT DOCUMENTS

| JP | 7 265278 A | 10/1995 |
| WO | WO 99/19739 A1 | 4/1999 |

* cited by examiner

*Primary Examiner*—Louis M Arana

(57) ABSTRACT

A magnetic resonance imaging system is provided with one or more electrical accessory devices, for example, catheters (10) or RF surface coils (6), which are intended for use during the examination of an object, as well as with a connection lead (13) which is arranged so as to extend through an examination zone (1) of the magnetic resonance imaging apparatus, which zone can be exposed to an RF field, and to connect the accessory device to a connection unit (12). In order to avoid heating of the connection lead (13) due to common mode currents induced in the connection lead by the RF field, which currents could lead to injury of a patient or damage of the accessory device or the connection unit (12), the connection lead (13) comprises at least two lead segment (131, 132, ...) which are coupled to one another via a transformer (141) and at least one matching network (151, 152) comprising at least one T-, L- and/or π-quadrupole, which each comprise at least two impedance elements in the form of a capacitor and/or an inductivity, between a lead segment (131; 132) and the inductive coupling element (141) for matching the impedances of both.

15 Claims, 3 Drawing Sheets

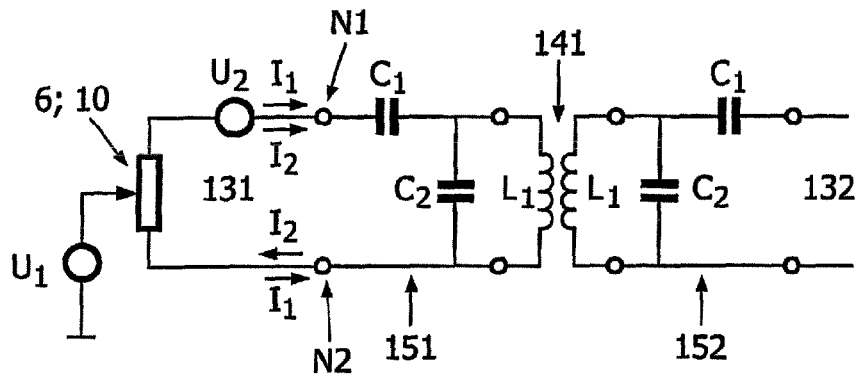
FIG. 3
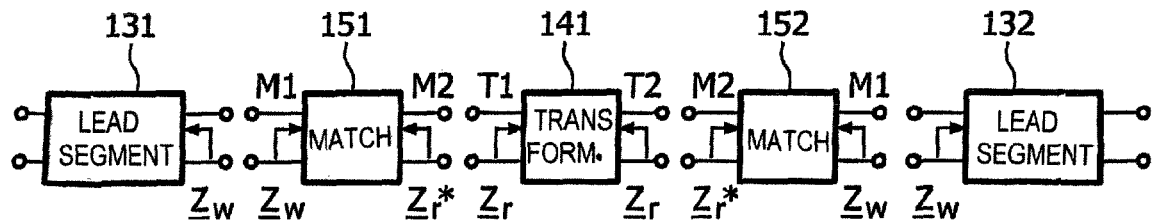
FIG. 4
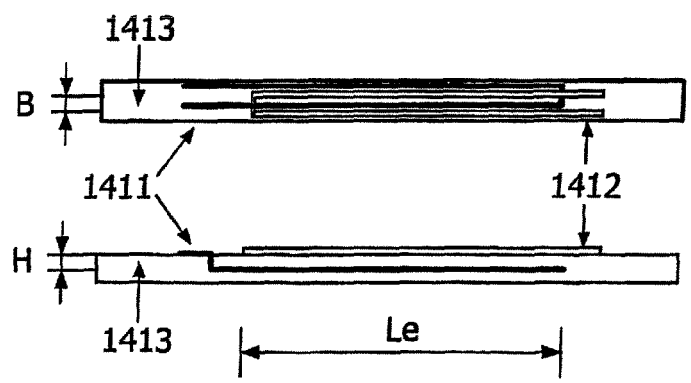
FIG. 5A
FIG. 5B

MAGNETIC RESONANCE IMAGING SYSTEM PROVIDED WITH AN ELECTRICAL ACCESSORY DEVICE

The invention relates to a magnetic resonance imaging system which is provided with one or more electrical accessory devices such as, for example, RF surface coils or catheters with coil elements which are intended for use during the examination of a patient or another object, as well as with a connection lead (transmission line) which is to be guided through an examination zone of the magnetic resonance imaging system, which zone can be exposed to an RF field, and which lead is intended to connect the accessory device to a connection unit such as, for example, a power supply or control unit. The invention relates as well to such a connection lead or transmission line and especially such a connection lead or transmission line in combination with a catheter or another invasive device for the examination of a human body.

A magnetic resonance (MR) imaging apparatus is used in particular for the examination and treatment of patients. The nuclear spins of the object to be examined are then aligned by a steady main magnetic field ($B_0$ field) and are excited by RF pulses ($B_1$ field). The relaxation signals thus formed are exposed to gradient magnetic fields for the purpose of localization and are received in order to form in known manner therefrom a 1- 2- or 3-dimensional image of the tissue examined.

Essentially two types of construction can be distinguished, that is, the so called open MR systems (vertical systems) in which a patient is introduced into an examination zone which is situated between the ends of a C-arm and hence is accessible from practically all sides, that is, also during the examination or treatment, and also MR systems which comprise a tubular examination space (axial systems) in which the patient is introduced.

RF coil systems serve for the transmission of the RF signals and the reception of the relaxation signals. In addition to the RF coil systems which are permanently built into the MR imaging apparatus, use is also made of RF surface coils which can be flexibly arranged, for example, as a sleeve or pad around or on the region to be examined.

Furthermore, use is made of catheters or other invasive devices which are introduced into the patient, for example, in order to take a sample of tissue during the imaging and which comprise at least one coil element, an oscillator or the like at least at the area of their tip for the purpose of localization in the image formed or for the purpose of imaging.

Accessory devices of this kind and other kinds are to be connected, via an electrical connection lead, to a connection unit, notably a power supply, a receiving device and/or a control device, which is situated outside the examination zone.

A problem in this respect is posed by the fact that the electromagnetic field generated by the RF coil systems induces RF common mode signals (currents) in the electrical connection lead leading to the relevant accessory device and in the surrounding body tissue; these currents involve not only the risk of disturbances or destruction of the accessory device and the connection unit, but notably can give rise to substantial heating of the connection lead and, in the case of surface coils and catheters, to burning of the patient when the leads are too close to or within the patient.

U.S. Pat. No. 6,677,754 discloses a way to suppress these hazards by means of transformers introduced into a coaxial cable. The inner and outer connector at the end of a first section of the coaxial cable are connected by a primary inductor in series with a first capacitor. The inner and outer connector at the end of a second section of the coaxial cable are connected by a secondary inductor in series with a second capacitor. Primary and secondary inductors are coupled to form a transformer. The capacitors are chosen such that the arrangement is resonant at the basic frequency $f_o$ of the RF to be transmitted. Thus, the resonant transformer resembles a tuned blocking filter, that suppresses dangerous common mode resonance that would lead to said heating of the cable. The filter passes the RF signal on the coaxial cable in differential mode.

This arrangement has the disadvantage that for a given characteristic impedance $Z_C$ of the coaxial matching of the coaxial cable and the transformer is only possible, if the condition $$M = \frac{Z_C}{2\pi f_0} \tag{1}$$

is satisfied, where M is the mutual coupling of the transformer. If a standard coaxial cable is used, which would be practical because it is only a replacement of the standard cable, the characteristic impedance is $Z_C$=50Ω.

For a 1.5 T MR system this means that M=124 nH. For a symmetric transformer with inductors L $$M=kL \tag{2}$$

holds where k is the coupling coefficient that is determined by the geometry of the transformer. For catheter applications miniaturized transformers are required and as a consequence values k>0.5 cannot be realized. This means that for perfect matching transformers with L>248 nH would have to be designed. This is hardly possible for miniaturized transformers within clinical catheters. For example, a 5 cm long and 500 μm wide single loop transformer, which is a reasonable wide, but already very long geometry to be used in catheters, has only L=64 nH. To design higher an inductance would lead to extended geometrical requirements and a higher stray capacity between the inductors. Unfortunately, the stray capacity is directly related to the common mode blocking capability of the resonant transformer. Placed along the conductor it moves the common mode resonant frequency to higher frequencies and thus influences the currents and the electrical field at basic frequency $f_0$. To increase the shift effect the stray capacity must be decreased. A small stray capacity can be reached by design and by using more than one resonant transformer distributed along the line.

The main result of these considerations is, that for miniaturized transformers, that are suitable for clinical catheters, matching to typical impedances of transmission lines (Z>30 Ohm) with only one capacitor is not possible.

Therefore it is an object of the invention to provide a magnetic resonance imaging system with one or more accessory devices or auxiliary equipment as mentioned above, in which on the one hand the common mode signals (currents) especially induced e.g. by RF pulses ($B_1$ field) in the connection leads (transmission lines) leading to these accessory devices do not constitute a risk for the patient or the accessory device or the connection unit, and in which on the other hand the wanted signals are transmitted with a minimum loss.

It is another object of the invention to provide a connection lead or transmission line for the above mentioned magnetic resonance imaging system and especially such a connection lead or transmission line in combination with a catheter or another invasive device for the examination of a human body which has dimensions and especially a diameter which is small enough for introduction into a human body and which has a minimum loss for the signals to be transmitted.

It is also an object of the invention to provide a connection lead or transmission line for the above mentioned magnetic resonance imaging system and especially such a connection lead or transmission line in combination with a catheter or another invasive device for the examination of a human body which enables an at least substantially disturbance-free and minimum-loss connection to be established with a connection unit, for example, a power supply device, receiving device and/or control device, during use in an examination zone of an MR imaging apparatus, that is, without the risk of burning of a patient by the connection lead or of damaging of the connection unit by RF common mode signals (currents) induced in the connection lead.

A magnetic resonance imaging system with a connection lead or transmission line is provided for connecting at least one electrical accessory device or auxiliary equipment to a connection unit, and which is to be guided through an RF field of the magnetic resonance imaging system. The connection lead or transmission line comprises at least two lead segments, which are coupled to one another via an inductive coupling element and at least one matching network comprising at least one T-, L- and/or π-quadrupole, which each comprise at least two impedance elements in the form of a capacitor and/or an inductivity, between a lead segment and the inductive coupling element for matching the impedances of both.

A considerable advantage of this lead or line is the fact that it is not only applicable for connecting auxiliary equipment in a MR system with a connection unit, but as well for connecting implanted devices like e.g. a heart pacemaker ("connection unit") with a related electrode or sensor ("auxiliary equipment") within the heart, or e.g. for connecting broken nerve lines with one another, wherein again the patient is prevented in case of a MR examination from being burnt by the leads or lines.

A particular advantage of these solutions is the fact that the transmission band width is considerably larger than in connection leads or transmission lines which are known e.g. from U.S. Pat. No. 6,677,754.

Furthermore, the connection lead in accordance with the invention can also be realized so as to have a very small loss and very small cross-section (for example, less than 2 mm), which, at least for the transformers is not possible for the matching proposed in the U.S. Pat. No. 6,677,754; this is of importance in particular with a view to the application involving invasive devices like catheters or sensors for clinical applications.

When the connection lead is used to connect a catheter or a surface coil with the related connection unit, the endangering of the patient by heating due to electromagnetic fields surrounding the connection lead is reliably precluded for practically all RF field strengths by suppressing the common mode resonances of the connection lead. The risk of damaging of the connection unit, notably by RF currents induced in the connection lead or adjacent tissue, is at least substantially precluded as well.

Finally, in comparison with other solutions, for example an optical transmission link with optical fibers, significantly fewer modifications of the components to be connected are required.

Further details, features and advantages of the invention will become apparent from the following description of preferred embodiments which is given with reference to the drawing. Therein:

FIG. 3 shows a schematic connection diagram of a connection lead in accordance with the invention;

Figure 6:
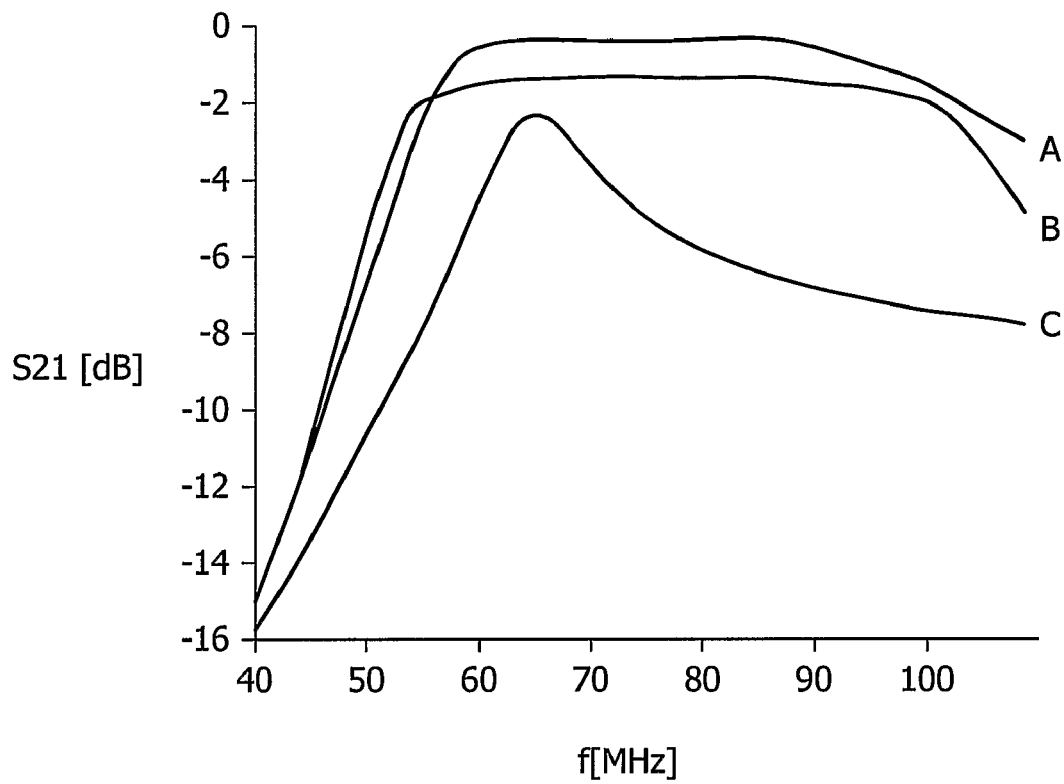
Figure 7:
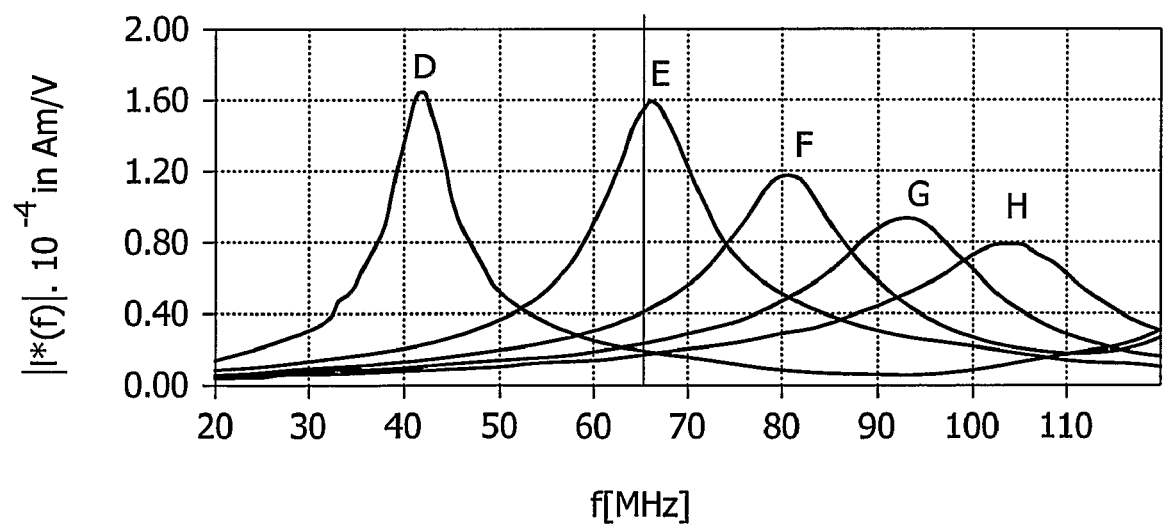

FIG. 4 a block diagram of the connection lead according to FIG. 3;

FIG. 5 a top and cut view of an exemplary embodiment of a transformer according to the invention;

FIG. 6 a diagram of the transmission coefficient in dependency of the frequency of the embodiment according to FIG. 5; and FIG. 7 several diagrams of the common mode resonances in dependency of the number of transformers.

Figure 1:
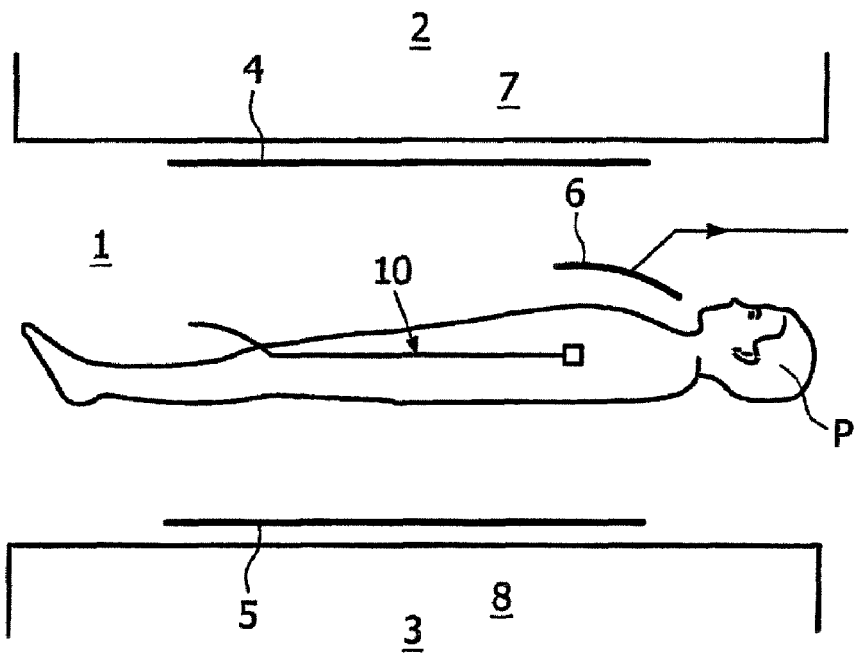
FIG. 1 is a diagrammatic side elevation of an MR imaging apparatus.

FIG. 1 shows the components of an open MR imaging apparatus which are of essential importance in relation to the generation and picking up of magnetic fields in an examination zone 1. Above and underneath the examination zone 1 there are provided respective magnet systems 2, 3 which serve to generate an essentially uniform main magnetic field ($B_0$ field for magnetizing the object to be examined, that is, for aligning the nuclear spins) whose magnetic flux density (magnetic induction) may be of the order of magnitude of from some tenths of Tesla to some Tesla. The main magnetic field essentially extends through a patient P in a direction perpendicular to the longitudinal axis of the patient (that is, in the x direction).

Planar or at least approximately planar RF conductor structures (surface resonators) in the form of RF transmission coils 4 serve to generate RF pulses ($B_1$ field) of the MR frequency whereby the nuclear spins are excited in the tissue to be examined, said RF transmission coils being arranged on the respective magnet systems 2 and 3. RF receiving coils 5 serve to pick up subsequent relaxation events in the tissue; these coils may also be formed by surface resonators provided on one of the magnet systems 2, 3. A common RF surface resonator can also be used for transmission and reception if it is suitably switched over, or the two RF surface resonators 4, 5 can serve for the alternating transmission and reception in common.

Furthermore, for the spatial discrimination and resolution of the relaxation signals emanating from the tissue of a patient P (localization of the excited states) there are also provided a plurality of gradient magnetic field coils 7, 8 whereby three gradient magnetic fields are generated which extend in the direction of the x axis. A first gradient magnetic field then varies essentially linearly in the direction of the x axis, while a second gradient magnetic field varies essentially linearly in the direction of the y axis, and a third gradient magnetic field varies essentially linearly in the direction of the z axis.

Electrical accessory devices or auxiliary equipments are required for given examinations. Such devices are, for example, RF surface coils 6 which are used in addition to or as an alternative for the planar RF receiving coils 5 (body coils) and which are arranged as RF receiving coils directly on the patient P or the zone to be examined. These RF surface coils 6 are generally constructed as flexible pads or sleeves.

Furthermore, in order to carry out the treatment on the patient P or to extract a tissue sample or to determine tissue parameters, use is often made of a catheter 10 which is introduced into the patient and whose position is to be visualized on a display screen.

Various passive and active methods are known for this purpose.

In the case of a passive method, for example as described in WO 99/19739, one or more small resonant oscillatory circuits on the tip of the catheter can be made visible in the MR image because of the fact that they lead to an increase of the RF field ($B_1$ field) in their direct vicinity during MR imaging, and hence also increase the magnetization of the neighboring nuclear spins. The transmission and/or receiving unit 11 is then formed by a receiving coil in the simplest case. However, it may additionally comprise sensors which pick up given properties of the surrounding tissue.

In the case of an active method it is possible to switch between two modes of operation in an alternating fashion, for example, by means of a switching unit 41 which is connected to the catheter 10 by way of a first output A and to the RF transmission coils 4 by means of a second output B. In the first mode of operation an MR image is generated in known manner by means of the MR apparatus, whereas in the second mode of operation a local nuclear magnetization is excited, using an activated transmission and/or receiving unit 11 which is arranged on the tip of the catheter, by transmission of RF pulses, the resultant relaxation events being received by the RF receiving coils 5, 6. The signal received itself serves to reproduce the position of the tip of the catheter in the MR image.

Figure 2:
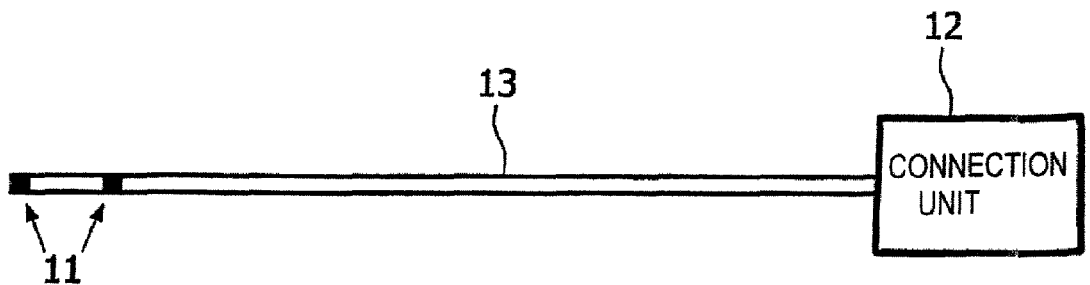
FIG. 2 is a diagrammatic representation of an accessory device.

FIG. 2 is a diagrammatic representation of an accessory device in the form of a catheter 10. On the tip of the catheter (or in a location at a slight distance therefrom) there could be arranged a transmission and/or receiving unit 11, for example, in the form of a microchip on which the necessary components (and possibly also the sensors) are realized, or the tip is provided with sensors or other means according to the prior art. At the end of the catheter 10 which is situated outside the patient there is provided a connection unit 12 in the form of a power supply unit and/or a receiving device and/or a control device which is connected, via a connection lead 13 which is guided through the catheter, to the transmission and/or receiving unit 11 and via which the transmission and/or receiving unit 11 is activated and possibly the measuring values and data from the sensors are transmitted.

In the case of an accessory device in the form of RF surface coils 6, such coils are also connected, via an electrical connection lead 13, to a corresponding connection unit 12 (power supply, receiving/transmitting device and/or control device).

FIG. 3 shows an electrical equivalent diagram of a connection lead 13 in accordance with the invention.

The RF pulses ($B_1$ field) transmitted by the RF transmission coils 4 induce, for example, in the part of the connection lead 13 which extends through the field of the RF transmission coils 4, a common mode signal which is generated by a first voltage source $U_1$, in the equivalent diagram. The common mode signal causes a corresponding first current $I_1$ in the connection lead 13. The signals induced by the subsequent MR relaxation events in the RF surface coil 6 or a catheter 10 (differential mode signals) are represented by a second voltage source $U_2$ (useful voltage) in the equivalent diagram and give rise to a second current $I_2$ in the connection lead 13.

The connection lead 13 has a plurality of lead segments 131, 132 . . . , wherein each two lead segments 131, 132 are connected to one another by means of an inductive coupling element like a transformer 141. The impedances of the lead segments 131, 132 and of the transformer 141 are matched to each other by means of each one matching network 151, 152 which comprises at least one T-, L- and/or -quadrupole, which each comprise at least two impedance elements in the form of a capacitor and/or an inductivity.

In the following a preferred embodiment of the invention shall be described in more details which comprises a matching network with a first serial capacitor $C_1$ and a second parallel capacitor $C_2$.

For the calculation of the matching capacitors $C_1$ and $C_2$ the entire transmission line is treated according to FIG. 4 as a chain of two-port units with input and output impedances Z.

These two-port units are the lead segments 131, 132, the matching networks 151, 152 and the transformer 141, for which each a two-port model is defined.

At basic frequency, a maximum of power should be transmitted, so power maximized matching has to be accomplished. This means that input impedances at any interface in the chain has to be complex conjugated. The input impedance of the transmission line $\underline{Z}_w$ is expected to be real (i.e. 50Ω for coaxial cables) and the input impedance $\underline{Z}_T$ of the transformer 141 is complex. To find an appropriate network, first the input impedance $\underline{Z}_T$ of the transformer 141 has to be known:

$$Z_T = \frac{V_1}{I_1} \quad (3)$$

The impedance matrix $\underline{Z}$:

$$\begin{bmatrix} \underline{V}_1 \\ \underline{V}_2 \end{bmatrix} = Z \begin{bmatrix} I_1 \\ I_2 \end{bmatrix} = \begin{bmatrix} Z_{11} & Z_{12} \\ Z_{21} & Z_{22} \end{bmatrix} \begin{bmatrix} I_1 \\ I_2 \end{bmatrix} \quad (4)$$

for an transformer $\underline{Z}$ is:

$$Z = \begin{bmatrix} R + j\omega L & j\omega M \\ j\omega M & R + j\omega L \end{bmatrix} \quad (5)$$

where $\underline{V}_n$ are the complex voltages and $\underline{I}_n$ the complex currents at the ports with all currents pointing into the ports, $\underline{Z}_{nm}$ are the impedance matrix elements (n=1, 2), R is the ohmic series resistor of the inductors. As mentioned above, the transformer 141 has to be terminated with its complex conjugate input impedance $\underline{Z}_T^*$, so $$\underline{V}_2 = -\underline{Z}_T^* \underline{I}_2 \quad (6)$$

Now, by using (1), (2) and (3), the following expression is obtained:

$$Re(\underline{Z}_T)^2 + Im(\underline{Z}_T)^2 + 2j\underline{Z}_{11}Im(\underline{Z}_T) - \underline{Z}_{11}^2 + \underline{Z}_{12}^2 = 0 \quad (7)$$

with $Re(\underline{Z}_T)$ and $Im(\underline{Z}_T)$ as the unknown real and imaginary part of the input impedance. This equation divides into a real part and an imaginary part, so the two unknowns can be determined. After calculating the input impedance the matching network can be designed. At port M1 the matching network 151 should have the input impedance of the transmission line 131 (for real input impedances reflection minimized and power transmission maximized are the same) and at port M2 the complex conjugate of the transformer 141. So it is clear that because of the two stated conditions, the matching network 151, 152 must have at least two degrees of freedom to form a determined system and to accomplish perfect matching. Thus a matching network represented in FIG. 3 results. The following equations result directly:

$$Z_{w1} = X_1 + \frac{X_2 Z_T}{X_2 + Z_T} \stackrel{!}{=} Z_w \quad (8)$$

$$Z_{w2} = \frac{X_2(X_1 + Z_w)}{X_1 + X_2 + Z_w} \stackrel{!}{=} Z_T^*$$

with $\underline{Z}_{wn}$ the input impedance of the matching network 151, 152 at port Mn (n=1, 2). From this the matching network elements $\underline{X}_1$ and $\underline{X}_2$ representing the reactances of $\underline{C}_1$ and $\underline{C}_2$ can be calculated. Matching network element $\underline{X}_1$ can be distributed equally to nodes N1 and N2 to form a symmetric signal path for avoidance of mode cross talk. The second matching network at port T2 results by changing ports M1 and M2.

For verification an embodiment of a transformer 141 was build which is shown in FIG. 5(A) in top view and in FIG. 5(B) in side view. The transformer 141 is realized on a substrate 1413 in the form of a first loop 1411 (Cu) and a second loop 1412 (Cu) each with a length Le of about 50 mm, a distance B of the lines of a loop of about 0.5 mm, a distance H of the loops of about 0.127 mm and a cross section of the loops of 35×25 µm. For these elongated single loop transformers using PCB technology L=64 nH, k=0.39, R=1.3Ω and $C_{stray}$=4 pF were measured. Using the equations above the first and second capacitors C1, C2 of the matching networks 151, 152 were calculated to be C1=61 pF, C2=56 pF and designed for 1.5 T and 50Ω characteristic impedance.

One matched prototype transformer had a minimum signal attenuation of 1.5 dB at 64 MHz and a bandwidth of 40 MHz with comparable low attenuation. To show the capability of suppressing dangerous common mode resonance, temperature measurements during an MR—tracking experiment were performed. A catheter transmission line with a length of 1.5 m based on a 1.1 mm thick 50 Ohm coaxial cable was built. The cable was intersected by three equidistant transformers 141 matched to the cable. For comparison a second equally long transmission line only using coaxial cable was build. Both lines were immersed in a water bath and situated off center in the bore. For each line, a real-time fully refocused gradient echo sequence (TR=4.2 ms, flip=5° . . . 90°) was applied for 1min at different flip angles and the temperature at the tip of the lines as well as at the transformers was measured immediately thereafter with a fiber optic thermometer (Luxtron). For a flip angle of 50° the transmission line without any transformers has shown a temperature rise of 13.6K after only 20 s was reached, whereas the temperature rise of the transmission line with three transformers was <0.3K even for 1 min and a flip angle of 90°.

A significant temperature increase at the area of the patient is thus avoided even in the case of high RF field strengths (for example, high SAR [Specific Absorption Rate] fully refocused gradient echo sequences as used for MR image guidance) as well as in the case of a large number of RF coils 4, thus avoiding damaging and/or failure of the accessory device 6, 10 and the connection unit 12.

For miniaturized versions of transformers 141 as they are required for interventional applications and especially catheters 10 perfect matching of the transformers 141 to miniature cables becomes possible by the above described matching networks.

The loss of the transmission line is reduced by 50%. This can be seen from a simulation of the transmission coefficients S21 as a function of frequency f in FIG. 6.

For matching with only one single serial capacitor C1 and a macroscopic transformer 141 (curve A) the loss at 64 MHz is about −0.23 dB (L=248 nH, Q=77, k=0.5, satisfying M=124 nH according to equation (1)).

For matching with a single serial capacitor C1 and a microscopic transformer 141 (L=66 nH, Q=20, k=0.393, cannot satisfy M=124 nH) the loss at 64 MHz is about −2.2 dB (curve C).

For two capacitors C1, C2 and a microscopic transformer 141 (L=66 nH, Q=20, k=0.393, need not satisfying M=124 nH) according to FIG. 3 the loss is only about −1.1 dB (curve B).

Since no preamplifiers are present at the tip of the catheter, the SNR of an intravascular imaging coil is improved by about 50%.

The bandwidth of the transmission line is increased to about 40 MHz such that other than MR signals can be transmitted. For example the resulting bandwidth can be used to transmit HF—energy to drive a preamp situated directly at the catheter tip.

Because of the wide bandwidth exact tuning of the transmission line to the MR frequency becomes obsolete FIG. 7 shows several diagrams of the common mode resonances in dependency of the number of transformers which are simulated in form of their stray capacitances. The measurements have been made for the standardized wire current and different numbers of capacitors with 5 pF which had been positioned symmetrically (with equal distances) along the wire. Curve D shows the resulting resonance without any capacitor, curve E with one capacitor, curve F with two capacitors, curve G with three capacitors and curve H with four capacitors. The results show that the more capacitors, the higher the resonance frequency.

The connection lead (transmission lines) 13 can be realized, for example, in the form of a two-wire lead (for example, a twisted pair), or a coaxial cable.

The described connection leads offer special advantages for the application of switchable RF surface coils 6 which are used notably in the case of SENSE (Sensitivity Encoding) imaging methods, because on the one hand the transfer of the received relaxation signals is thus possible as described above, while on the other hand there is no risk of the patient being burnt due to resonance effects caused by the RF power emitted by the RF transmission coil 4 and the inherent heating of the connection lead 13. The risk for the accessory device 6, 11 or the connection unit 12 is also precluded to a high degree. The same also holds for high RF field strengths.

The use of such connection leads requires substantially fewer system modifications than, for example, the optical transmission of the relevant signals from and to the RF surface coils, catheters or other accessory devices.

Furthermore, the same or even simpler connectors can be used for connecting the connection lead 13 to the relevant connection unit 12 (power supply, receiving device and/or control device).

In comparison with the known solutions and as shown in FIGS. 6 and 7, the connection leads 13 according to the invention have a comparatively large bandwidth so that, for example, it is also possible to transfer a plurality of receiving signals via a connection lead.

Furthermore, the band width can be used for other purposes like for example transmitting power and/or control signals to an electronic device like a pre-amplifier for the MR signals, for another sensor (which is provided e.g. for detecting parameters of the tissue to be examined), or for a micro actuator.

Detection signals of other sensors (e.g. for blood pressure, internal EKG, oxygen partial pressure etc.) or data signals can be transmitted using the band width of the connection lead according to the invention.

Preferably, all these extra signals are transmitted in the region of the band width above the region which is used for transmitting the MR signals. By this, upper harmonic waves of the extra signals which could possibly interfere with or disturb the MR signals, are avoided.

In order to further optimize this, the transmission curve is preferably tuned such that the MR signal is transmitted with minimum loss and the frequency range of the MR signal is near the low-end frequency of the transmission band so that the frequency range for the extra signals is broadened.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

The invention claimed is:

1. A magnetic resonance imaging system with a connection lead or transmission line which is especially provided for connecting at least one electrical accessory device or auxiliary equipment to a connection unit, which connection lead or transmission line is to be guided through an RF field of the magnetic resonance imaging system, the connection lead or transmission line comprising:
an inductive coupling element;
a first lead segment;
a first matching network comprising at least one T-, L- and/or π-quadrupole, which quadrupole includes at least two impedance elements in the form of a capacitor and/or an inductivity, between the first lead segment and the inductive coupling element for matching the impedances of both;
a second lead segment;
a second matching network comprising at least one T-, L- and/or π-quadrupole, which quadrupole includes at least two impedance elements in the form of a capacitor and/or an inductivity, between the second lead segment and the inductive coupling element for matching the impedances of both.

2. The magnetic resonance imaging system as claimed in claim 1, in which the matching networks each include:
a first serial capacitor connected in series with the inductive coupling element; and
a second parallel capacitor connected between the series connected first serial capacitor and inductive coupling unit and a respective one of the first and second lead segments.

3. The magnetic resonance imaging system as claimed in claim 1, in which the inductive coupling element is a miniaturized transformer.

4. The magnetic resonance imaging system as claimed in claim 1, in which the inductive coupling element is a pair of conductor loops.

5. The magnetic resonance imaging system as claimed in claim 1, in which the connection lead or transmission line includes a two-wire lead or a coaxial lead.

6. The magnetic resonance imaging system as claimed in claim 1, in which the accessory device or the auxiliary equipment is an RF surface coil or a catheter for invasive clinical examinations.

7. The magnetic resonance imaging system as claimed in claim 1, wherein:
the inductive coupling element has a complex impedance;
the first matching network has an impedance across a pair of first segment nodes equal to a first real impedance of the first lead segment and an impedance across a pair of inductive coupling element nodes which is a complex conjugate of the complex inductive coupling impedance; and
the second matching network has an impedance across a pair of second segment nodes equal to a second real impedance of the second lead segment and an impedance across a pair of inductive coupling element nodes which is a complex conjugate of the complex inductive coupling impedance.

8. The magnetic resonance imaging system as claimed in claim 7, wherein:
the at least two impedance elements of the first matching network are distributed equally to the first segment nodes forming a symmetric signal path to avoid mode cross talk; and
the at least two impedance elements of the second matching network are distributed equally to the second segment nodes forming a symmetric signal path to avoid mode cross talk.

9. A connection lead or transmission line especially for connecting at least one electrical accessory device or auxiliary equipment to a connection unit, the connection lead or transmission line comprising:
a first lead segment having a preselected input impedance $Z_W$;
an inductive coupling element having a preselected input impedance $Z_T$; and
a first matching network having a first port connected with the first lead segment and a second port connected to an input of the inductive coupling element, at least one T-, L- and/or π-quadrupole, which each comprise at least two impedance elements $X_1$ and $X_2$ between first port and the second port, the impedance being sized and configured such that:

$$X_1 + \frac{X_2 Z_T}{X_2 + Z_T} = Z_W$$

$$\frac{X_2(X_1 + Z_W)}{X_1 + X_2 + Z_W} = Z_T^*$$

where $\underline{Z}^*_T$ is a complex conjugate of $\underline{Z}_T$.

10. The connection lead or transmission line as claimed in claim 9, in which the matching network comprises a first serial capacitor and a second parallel capacitor.

11. The connection lead or transmission line as claimed in claim 9, in which the inductive coupling element is a miniaturized transformer.

12. The connection lead or transmission line as claimed in claim 9, in which the inductive coupling element is a pair of conductor loops.

13. A catheter which forms an accessory device or an auxiliary equipment in a magnetic resonance imaging system, in combination with the connection lead or transmission line according to claim 9.

14. The connection lead or transmission line as claimed in claim 9, further including:
a second lead segment having a preselected input impedance $Z_W$; and,
a second matching network having one port connected with the second lead segment and another port connected to the inductive coupling element, at least one T-, L- and/or π-quadrupole, which each comprise at least two impedances $X_1$ and $X_2$ between the one port and the another port, the impedances being sized and configured such that:

$$X_1 + \frac{X_2 Z_T}{X_2 + Z_T} = Z_W$$

$$\frac{X_2(X_1 + Z_W)}{X_1 + X_2 + Z_W} = Z_T^*$$

where $\underline{Z}^*_T$ is a complex conjugate of $\underline{Z}_T$.

15. The connection lead or transmission line as claimed in claim 14, wherein:

the inductive coupling unit has a complex impedance;
the first matching network having an impedance across a pair of first segment nodes equal to the a real impedance of the first lead segment and an impedance across a pair of inductive coupling element nodes which is a complex conjugate of the inductive coupling impedance; and
the second matching network having an impedance across a pair of second segment nodes equal to a second real impedance of the second lead segment and an impedance across a pair of inductive coupling element nodes which is a complex conjugate of the inductive coupling impedance.

* * * * *